(12) United States Patent
Wang et al.

(10) Patent No.: US 12,265,118 B2
(45) Date of Patent: Apr. 1, 2025

(54) FLEXIBLE CIRCUIT BOARD TEST DEVICE

(71) Applicant: HONOR DEVICE CO., LTD., Shenzhen (CN)

(72) Inventors: Ruifei Wang, Shenzhen (CN); Wenhao Wang, Shenzhen (CN); Xiujuan Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/008,378

(22) PCT Filed: Aug. 19, 2022

(86) PCT No.: PCT/CN2022/113578
§ 371 (c)(1),
(2) Date: Dec. 5, 2022

(87) PCT Pub. No.: WO2023/045652
PCT Pub. Date: Mar. 30, 2023

(65) Prior Publication Data
US 2024/0192264 A1    Jun. 13, 2024

(30) Foreign Application Priority Data
Sep. 23, 2021    (CN) .......................... 202111113658.X

(51) Int. Cl.
*G01R 31/28* (2006.01)
(52) U.S. Cl.
CPC ................ *G01R 31/2808* (2013.01)
(58) Field of Classification Search
CPC ........ G01R 31/2808; G01N 3/20; G01N 3/32; G01N 2203/0007; G01N 2203/0282; G01N 2203/0647; G01N 3/04; G01N 3/02
See application file for complete search history.

(56) References Cited

U.S. PATENT DOCUMENTS

| 6,043,669 A | 3/2000 | Carroll |
| 8,461,860 B2 | 6/2013 | Kim et al. |
| (Continued) | | |

FOREIGN PATENT DOCUMENTS

| CA | 2217591 A1 | 4/1999 |
| CN | 101329364 A | 12/2008 |
| (Continued) | | |

OTHER PUBLICATIONS

Nakagaki et al., "Trans-Dock: Expanding the Interactivity of Pin-based Shape Displays by Docking Mechanical Transducers," Papers Session 2: Creating and Changing Shapes, TEI '20, Feb. 9-12, 2020, Sydney, NSW, Australia, p. 131-142.

(Continued)

*Primary Examiner* — Akm Zakaria
(74) *Attorney, Agent, or Firm* — WOMBLE BOND DICKINSON (US) LLP

(57) ABSTRACT

A flexible circuit board test device is disclosed. The flexible circuit board test device includes a main clamp, a first rotating shaft arm and a second rotating shaft arm; the first rotating shaft arm and the second rotating shaft arm are rotatably mounted on a first mobile table and a second mobile table through a first main shaft and a second main shaft respectively; the first rotating shaft arm and the second rotating shaft arm each are provided with a sandwich space for simulating a motion space of a flexible circuit board; the first mobile table is provided with a first driving component in transmission connection with the first main shaft, the second mobile table is provided with a second driving component in transmission connection with the second main shaft; and the first rotating shaft arm and the second rotating shaft arm are provided with auxiliary clamps.

19 Claims, 13 Drawing Sheets

(56) References Cited

U.S. PATENT DOCUMENTS

| | | | |
|---|---|---|---|
| 9,354,150 B2 | 5/2016 | Lee | |
| 9,443,819 B2 * | 9/2016 | Afable | H01L 24/75 |
| 11,525,746 B2 | 12/2022 | Bok et al. | |
| 2003/0077923 A1 * | 4/2003 | Matsuo | H01R 12/82 |
| | | | 439/67 |
| 2014/0104766 A1 * | 4/2014 | Clayton | G06F 1/20 |
| | | | 361/728 |
| 2015/0253229 A1 | 9/2015 | Grondin et al. | |
| 2021/0341366 A1 | 11/2021 | Wu et al. | |
| 2024/0098902 A1 * | 3/2024 | Chen | B29C 53/04 |

FOREIGN PATENT DOCUMENTS

| | | | | |
|---|---|---|---|---|
| CN | 202183025 U | 4/2012 | | |
| CN | 103487710 A | 1/2014 | | |
| CN | 104344996 A | 2/2015 | | |
| CN | 107884283 A | 4/2018 | | |
| CN | 207385772 U | 5/2018 | | |
| CN | 207516162 U | 6/2018 | | |
| CN | 109142112 A | 1/2019 | | |
| CN | 109406319 A | 3/2019 | | |
| CN | 208937318 U | 6/2019 | | |
| CN | 110208111 A | 9/2019 | | |
| CN | 110296900 A * | 10/2019 | | G01N 3/02 |
| CN | 209961613 U | 1/2020 | | |
| CN | 110879642 A | 3/2020 | | |
| CN | 110895226 A | 3/2020 | | |
| CN | 111089789 A | 5/2020 | | |
| CN | 210488529 U | 5/2020 | | |
| CN | 111289387 A | 6/2020 | | |
| CN | 212159397 U | 12/2020 | | |
| CN | 212206937 U | 12/2020 | | |
| CN | 112198064 A | 1/2021 | | |
| CN | 112362476 A | 2/2021 | | |
| CN | 107976372 B | 3/2021 | | |
| CN | 112504823 A | 3/2021 | | |
| CN | 213181066 U | 5/2021 | | |
| CN | 213213973 U | 5/2021 | | |
| CN | 112945773 A | 6/2021 | | |
| CN | 213689193 U * | 7/2021 | | G01N 3/08 |
| CN | 113358490 A | 9/2021 | | |
| CN | 113567275 A | 10/2021 | | |
| FR | 2899969 A1 | 10/2007 | | |
| JP | S63314441 A | 12/1988 | | |
| JP | 2014130048 A | 7/2014 | | |
| KR | 20110114256 A | 10/2011 | | |
| KR | 20140088356 A | 7/2014 | | |
| KR | 20160125757 A | 11/2016 | | |
| KR | 20160141254 A | 12/2016 | | |
| KR | 101777792 B1 | 9/2017 | | |
| KR | 20190010809 A | 1/2019 | | |
| KR | 20190029032 A | 3/2019 | | |
| KR | 20190130374 A | 11/2019 | | |
| KR | 102101287 B1 | 5/2020 | | |
| KR | 102145682 B1 | 8/2020 | | |
| TW | M552596 U | 12/2017 | | |

OTHER PUBLICATIONS

Liu Yanling, et al., "A Study on Stiffness Measurement Used for Flexible Display Devices," Information Technology & Standardization. 2018(12) p. 11-13+18.

* cited by examiner

FLEXIBLE CIRCUIT BOARD TEST DEVICE

This application is a national stage of International Application No. PCT/CN2022/113578 filed on Aug. 19, 2022, which claims priority to Chinese Patent Application No. 202111113658.X, filed on Sep. 23, 2021. The disclosures of both of the aforementioned application are hereby incorporated by reference in their entireties.

TECHNICAL FIELD

This application relates to the technical field of circuit board test devices, and in particular, to a device for testing performance of a flexible circuit board.

BACKGROUND

In an electronic device, a flexible circuit board is usually used to implement electrical connection among components. To avoid the problems of failure, such as breakage, of flexible circuit boards during use, it is usually necessary to test the performance of the flexible circuit boards in a process of designing the flexible circuit boards, so as to guide the design of the flexible circuit boards.

After integrated equipment is assembled, a flexible circuit board inside the integrated equipment cannot be directly detected and observed, and therefore a flexible circuit board test device is needed to test the flexible circuit board.

A typical flexible circuit board test device is mainly used to test a flexible circuit board that bends with the bending of a screen in a foldable phone. Such a test device has a double-flap structure, with a left flap and a right flap that are hinged with each other. The test device can simulate unfolding and folding of a mobile phone by driving the left flap and the right flap to perform unfolding and folding actions, so as to perform a bending test on a flexible circuit board. During the test, a flexible circuit board sample needs to be adhered onto a pairing surface of the left flap and the right flap, with two ends of the flexible circuit board sample connected to a terminal through manual welding of wires. A quantity of bending times and resistance are recorded by a data acquisition and monitoring control system for further analysis and determination.

Such test devices can simply simulate bending actions of flexible circuit boards due to relatively limited functions, so that such test devices cannot provide more comprehensive and accurate test data for the design of the flexible circuit boards.

For example, each of the test devices can only simulate one bending radius. To simulate different bending radii, different test devices are needed. In addition, such test devices cannot simulate assembly morphology of flexible circuit boards. Especially for electronic devices with relative motion scenarios such as folding and retracting among components, because flexible circuit boards will move among structural components, analysis on motion trajectory is very important, but it is difficult for such test devices to analyze motion trajectory of flexible circuit boards.

SUMMARY

An embodiment of this application provides a flexible circuit board test device. The test device can provide more comprehensive and accurate test data for the design of a flexible circuit board.

The flexible circuit board test device according to this embodiment of this application is provided with a main clamp, a first rotating shaft arm, and a second rotating shaft arm, where the main clamp is generally located at a central position of the device and is configured to locate a middle area of a flexible circuit board to be tested; the first rotating shaft arm and the second rotating shaft arm are rotatably mounted on a first mobile table and a second mobile table through a first main shaft and a second main shaft respectively; the first main shaft and the second main shaft are located on two sides of the main clamp, and the first rotating shaft arm and the second rotating shaft arm each are provided with a sandwich space for simulating a motion space of the flexible circuit board. After the middle of the flexible circuit board is located by the main clamp, two ends of the flexible circuit board enter the sandwich space of the first rotating shaft arm and the sandwich space of the second rotating shaft arm respectively. After being located by auxiliary clamps in the sandwich space, the two ends of the flexible circuit board and the auxiliary clamps are electrically conductive. During the test, a first driving component and a second driving component provide power to drive the first rotating shaft arm and the second rotating shaft arm to unfold or fold, so as to simulate an actual service state of the flexible circuit board in a product.

By simulating the motion space of the flexible circuit board through the sandwich spaces formed inside the first rotating shaft arm and the second rotating shaft arm, actual assembly morphology and motion trajectory of the flexible circuit board may be tested, so as to provide more comprehensive and accurate test data for the design of the flexible circuit board. In addition, the mobile tables on two sides of the main clamp can be driven by the driving components to move, and positions of the first rotating shaft arm and the second rotating shaft arm with respect to the main clamp may be adjusted. Therefore, a bending radius of the flexible circuit board at the main clamp may be adjusted to perform bending tests with different radii, which is compatible with actual service scenarios of most products (for example, a foldable phone), so that the development requirements of different products can be met by using only one set of test device.

Optionally, the first mobile table and the second mobile table are respectively provided with a mobile table driving mechanism, and the mobile table driving mechanism is configured to drive the first mobile table and the second mobile table to move in a horizontal plane to adjust positions of the first mobile table and the second mobile table with respect to the main clamp, so as to adjust the bending radius of the flexible circuit board, and simulate actual operating conditions of different products, thereby expanding the test range.

Optionally, the mobile table driving mechanism includes a base and an intermediate carrier; the mobile tables are mounted on the intermediate carrier through a first slide rail, and the intermediate carrier is provided with a third driving component for driving the mobile tables to move along a first direction defined by the first slide rail; and the intermediate carrier is mounted on the base through a second slide rail, and the base is provided with a fourth driving component for driving the intermediate carrier to move along a second direction defined by the second slide rail.

Optionally, the first mobile table is provided with a first frame, the second mobile table is provided with a second frame, and the first main shaft and the second main shaft are respectively mounted on adjacent edges of the first frame and the second frame.

Optionally, the first rotating shaft arm and the second rotating shaft arm each include a base plate, and a clamping plate located on one side of a pairing surface of the base plate and connected to the base plate, the base plate of the first rotating shaft arm is connected to the first main shaft, the base plate of the second rotating shaft arm is connected to the second main shaft, and the sandwich space is formed between the clamping plate and the base plate.

Optionally, a first adjusting mechanism is disposed between the clamping plate and the base plate, and the first adjusting mechanism is configured to adjust a spacing between the clamping plate and the base plate. In this way, sandwich spaces with different thicknesses may be simulated, so that the thicknesses of the sandwich spaces are basically consistent with actual thicknesses of inner spaces of different products, and a test process is closer to an actual using process. Therefore, more accurate test results and data can be obtained.

Optionally, the first adjusting mechanism includes two sets of upper connecting plates and lower connecting plates located at upper edges and lower edges that are of the base plate and the clamping plate and that are on one side away from the main clamp, the upper connecting plates and the lower connecting plates are respectively provided with oblong holes perpendicular to the base plate in a length direction, the upper connecting plates are connected by an upper connector running through the oblong holes, and the lower connecting plates are connected by a lower connector running through the oblong holes.

Optionally, the first rotating shaft arm has a lateral width smaller than that of the second rotating shaft arm, upper and lower ends of the first rotating shaft arm go beyond upper and lower ends of the second rotating shaft arm; in a paired state, the upper connecting plate and the lower connecting plate of the first rotating shaft arm and the upper connecting plate and the lower connecting plate of the second rotating shaft arm are misaligned with each other.

Optionally, a second adjusting mechanism is disposed between the clamping plate and the upper connecting plate and the lower connecting plate thereof, and the second adjusting mechanism is configured to adjust an included angle between the clamping plate and the base plate, so as to simulate an included angle between a middle frame and a screen after integrated equipment is folded, thereby further enhancing test capabilities.

Optionally, the second adjusting mechanism includes: a rotating structure in which the clamping plate is connected to the upper connecting plate and the lower connecting plate thereof through an oscillating shaft; and a fifth driving component disposed at bottom of the lower connecting plate of the clamping plate, where the fifth driving component is configured to drive the clamping plate to rotate around the oscillating shaft.

Optionally, a quantity of the auxiliary clamps is more than one, and the plurality of auxiliary clamps are arranged in a vertical direction on the base plate.

Optionally, the base plate is provided with a slot for accommodating the auxiliary clamps, the plurality of auxiliary clamps are connected as a whole to form an auxiliary clamp assembly, the auxiliary clamp assembly is mounted on the base plate through a third adjusting mechanism, and the third adjusting mechanism is configured to adjust a posture of the auxiliary clamp assembly with respect to the base plate, so as to simulate different connection modes and/or lead-out modes that may exist between the flexible circuit board and other electrical components in practice.

Optionally, the third adjusting mechanism includes an upper rotating shaft and a lower rotating shaft located at upper and lower ends of the auxiliary clamp assembly, the auxiliary clamp assembly is rotatably mounted in the slot of the base plate through the upper rotating shaft and the lower rotating shaft, the lower rotating shaft is connected to an adjusting disc, and the adjusting disc is provided with a plurality of connecting holes centered on the lower rotating shaft and can be connected to the base plate through different connecting holes.

Optionally, a fourth adjusting mechanism is disposed between the auxiliary clamp assembly and the base plate, and the fourth adjusting mechanism is configured to adjust a lateral position of the auxiliary clamp assembly on the base plate. Therefore, various flexible circuit boards with different lengths may be tested, thereby further expanding the test range of the test device.

Optionally, the fourth adjusting mechanism includes sliding grooves disposed at the upper edge and the lower edge of the base plate, the upper rotating shaft and the lower rotating shaft of the third adjusting mechanism can move in a lateral direction in the sliding grooves and can be located by locating components, and a surface of the base plate is provided with a hollow area that provides a lateral movement space for the auxiliary clamp assembly.

Optionally, a frame opening corresponding to the auxiliary clamps is formed on the clamping plate.

Optionally, the auxiliary clamps are provided with an electrical connection structure, the electrical connection structure includes an electrical connection seat and an electrical connection cover that can be buckled with each other, a space for accommodating ends of the flexible circuit board is formed between the electrical connection seat and the electrical connection cover, and an inner surface of the electrical connection seat or the electrical connection cover is provided with conductive pins in contact and conduction with pads at one end of the flexible circuit board.

Optionally, the inner surface of the electrical connection seat or the electrical connection cover is provided with a locating column for locating the ends of the flexible circuit board.

Optionally, the flexible circuit board test device further includes an image acquisition device that is mounted in an area above the main clamp through a position adjusting mechanism, and the image acquisition device is configured to observe and record motion trajectory and morphology of the flexible circuit board.

1. Main clamp; 2. First rotating shaft arm; 3. Second rotating shaft arm; 4. Auxiliary clamp; 5. Flexible circuit board; 51. Pad; 6. First main shaft; 7. Second main shaft; 8. First mobile table; 9. Second mobile table; 10. Image acquisition device; 11. First frame; 12. Second frame; 13. First driving component; 14. Second driving component; 15. First transmission wheel; 16. Second transmission wheel; 17. Transmission belt; 18. Third transmission wheel; 19. Fourth transmission wheel; 20. base; 21. Intermediate carrier; 22. First slide rail; 23. Third driving component; 24. Second slide rail; 25. Fourth driving component; 26. Base plate; 261. Upper connecting plate; 262. Lower connecting plate; 27. Clamping plate; 271. Upper connecting plate; 272. Lower connecting plate; 28. Oscillating shaft; 29. Fifth driving component; 30. Receding structure; 31. Upper rotating shaft; 32. Lower rotating shaft; 33. Adjusting disc; 34. Connecting hole; 35. Sliding groove; 36. Locating component; 37. Electrical connection seat; 38. Electrical connection cover; 39. Conductive pin; 40. Locating column; and 101. Position adjusting mechanism.

DESCRIPTION OF EMBODIMENTS

To enable a person skilled in the art to better understand solutions of this application, this application will be further described in detail with reference to accompanying drawings and specific implementations.

Terms such as "upper", "lower", "inner", and "outer" are defined herein based on positional relationships shown in the accompanying drawings. Depending on different accompanying drawings, the corresponding positional relationships may also change, and therefore cannot be interpreted as an absolute limitation to the protection scope. Terms such as "first", and "second" are only used to distinguish one component from another with the same name, and does not necessarily require or imply that there are any actual relationship or order between these components.

Figure 1:
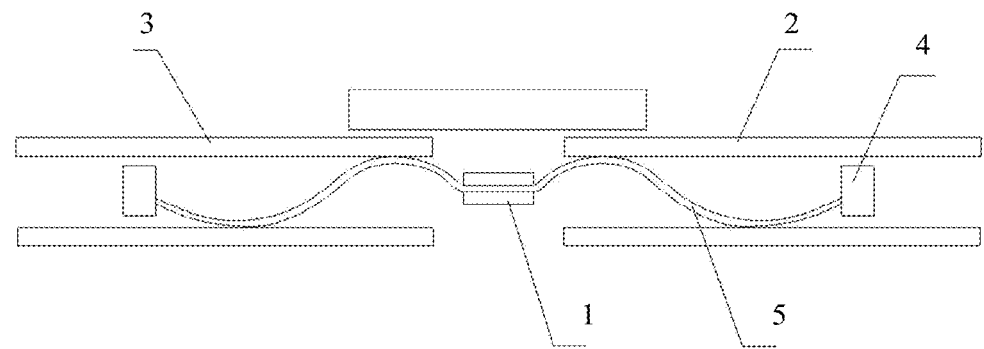
FIG. 1 is a schematic diagram showing a design of a flexible circuit board test device according to an embodiment of this application, where the flexible circuit board test device shown in the figure is in an unfolded state.
Figure 2:
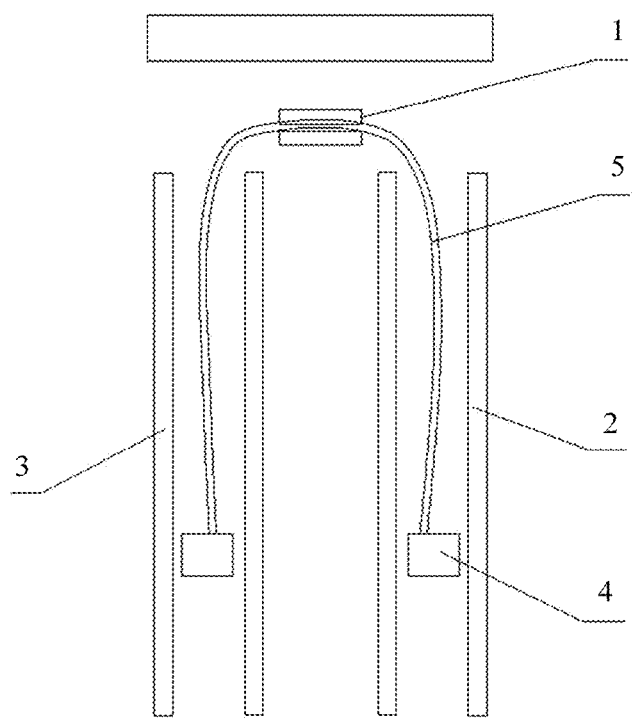
FIG. 2 is a schematic diagram showing a design of a flexible circuit board test device according to an embodiment of this application, where the flexible circuit board test device shown in the figure is in a folded state.

As shown in FIG. 1 and FIG. 2, this embodiment provides a flexible circuit board test device. The test device mainly includes components such as a main clamp 1, a first rotating shaft arm 2, a second rotating shaft arm 3, and auxiliary clamps 4. The test device simulates a motion space of a flexible circuit board in integrated equipment through the cooperation among the main clamp 1, the first rotating shaft arm 2, the second rotating shaft arm 3, and the auxiliary clamps 4. A semi-open structure formed therefrom allows dynamic trajectory of a flexible circuit board 5 to be visualized. With the use of an image acquisition device 10 (for example, a CCD camera), motion trajectory and morphology of the flexible circuit board 5 may be measured and recorded, so as to test morphology of the flexible circuit board 5 during bending, and resolve the problem that the morphology of the flexible circuit board 5 in the integrated equipment cannot be directly detected.

Figure 3:
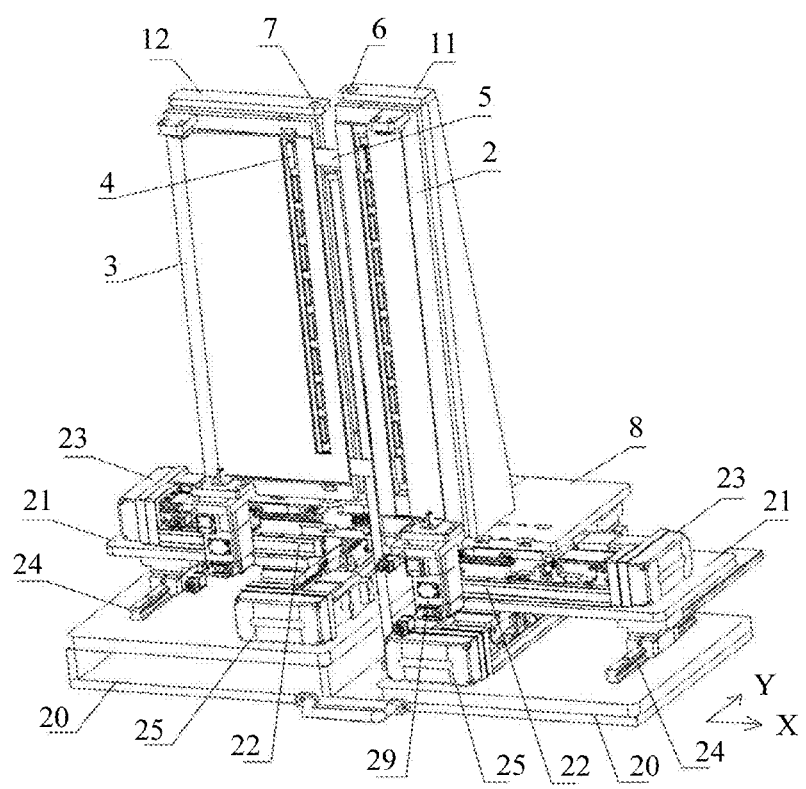
FIG. 3 is an axonometric view of a flexible circuit board test device according to an embodiment of this application.
Figure 4:
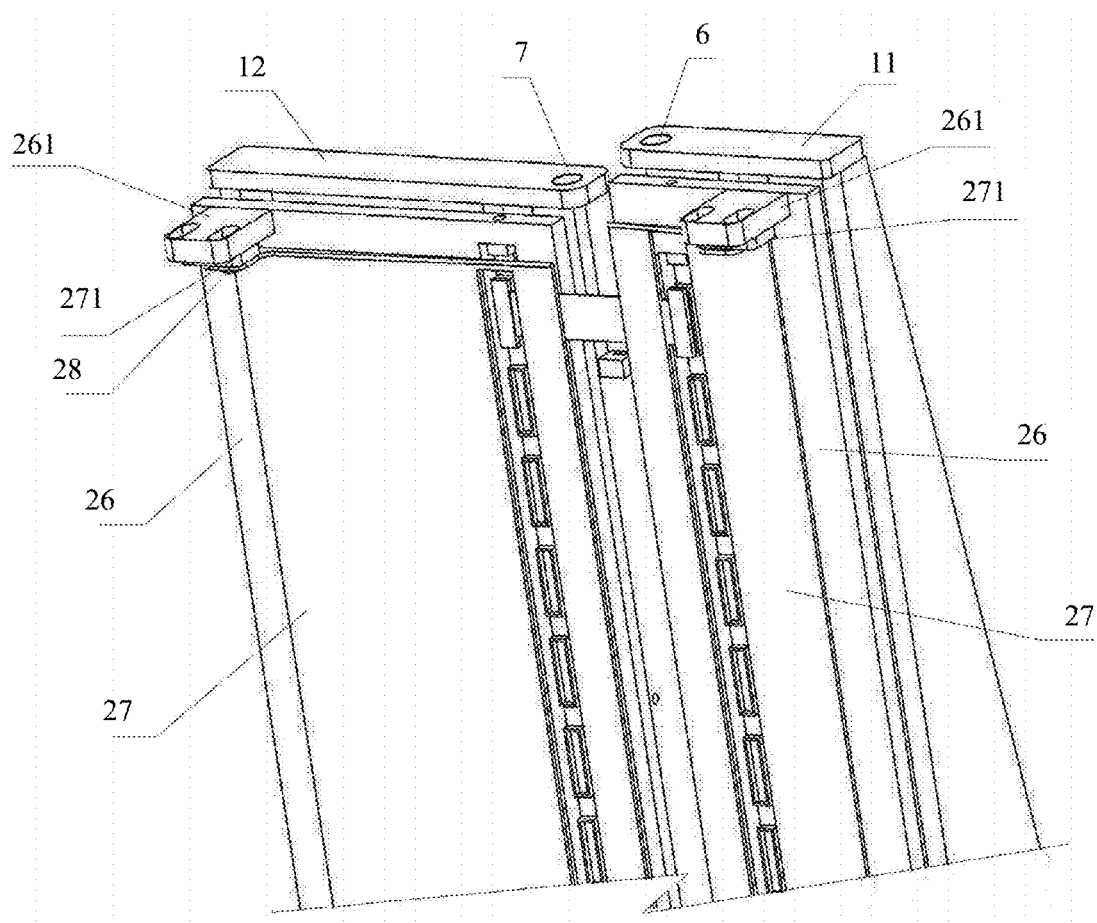
FIG. 4 is a partially enlarged view of FIG. 3.

Specifically, as shown in FIG. 3 and FIG. 4, the main clamp 1 (the mounting position of the main clamp is indicated by a central axis in the figures) is generally located in the center of the device, and is configured to locate a middle area of the flexible circuit board 5. The main clamp is available in different morphology and location modes, for example, the main clamp may be fixed from the middle of the flexible circuit board 5 through clamping.

The first main shaft 6 and the second main shaft 7 are located on left side and right side of the main clamp 1, respectively. The first rotating shaft arm 2 is rotatably mounted on a first mobile table 8 through the first main shaft 6, and the second rotating shaft arm 3 is rotatably mounted on a second mobile table 9 through the second main shaft 7. The first rotating shaft arm 2 and the second rotating shaft arm 3 can rotate on the mobile tables on which the first rotating shaft arm 2 and the second rotating shaft arm 3 are respectively mounted. The first mobile table 8 is provided with a first frame 11, and the second mobile table 9 is provided with a second frame 12. The first frame 11 and the second frame 12 are rectangular frames vertically fixed on the first mobile table 8 and the second mobile table 9, and vertical side plates on two sides of the frames are trapezoidal with a narrow upper part and a wide lower part, so as to improve structural strength and stability of the frames. The first main shaft 6 and the second main shaft 7 are respectively mounted on adjacent sides of the first frame 11 and the second frame 12, that is, the sides close to the main clamp 1.

The first rotating shaft arm 2 and the second rotating shaft arm 3 may be directly connected to the first main shaft 6 and the second main shaft 7, or may be indirectly connected to the first main shaft 6 and the second main shaft 7 through a connector.

Figure 5:
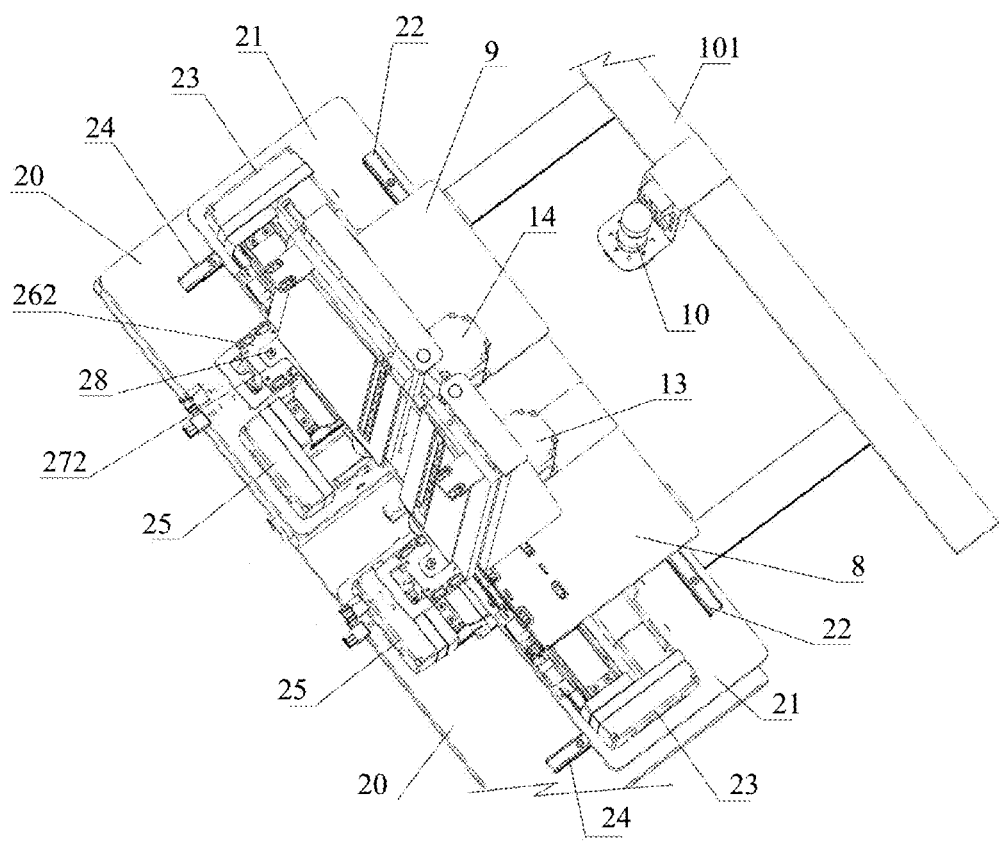
FIG. 5 is an axonometric view of a flexible circuit board test device according to an embodiment of this application from another perspective.
Figure 6:
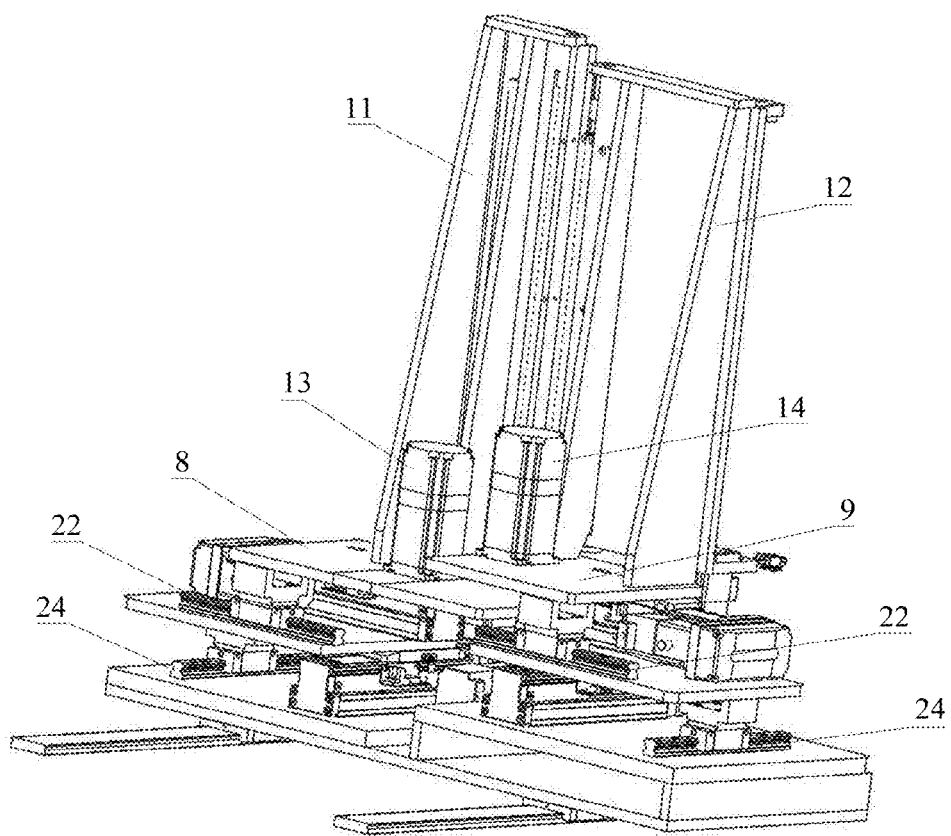
FIG. 6 is an axonometric view of a flexible circuit board test device according to an embodiment of this application when viewed from the rear.
Figure 7:
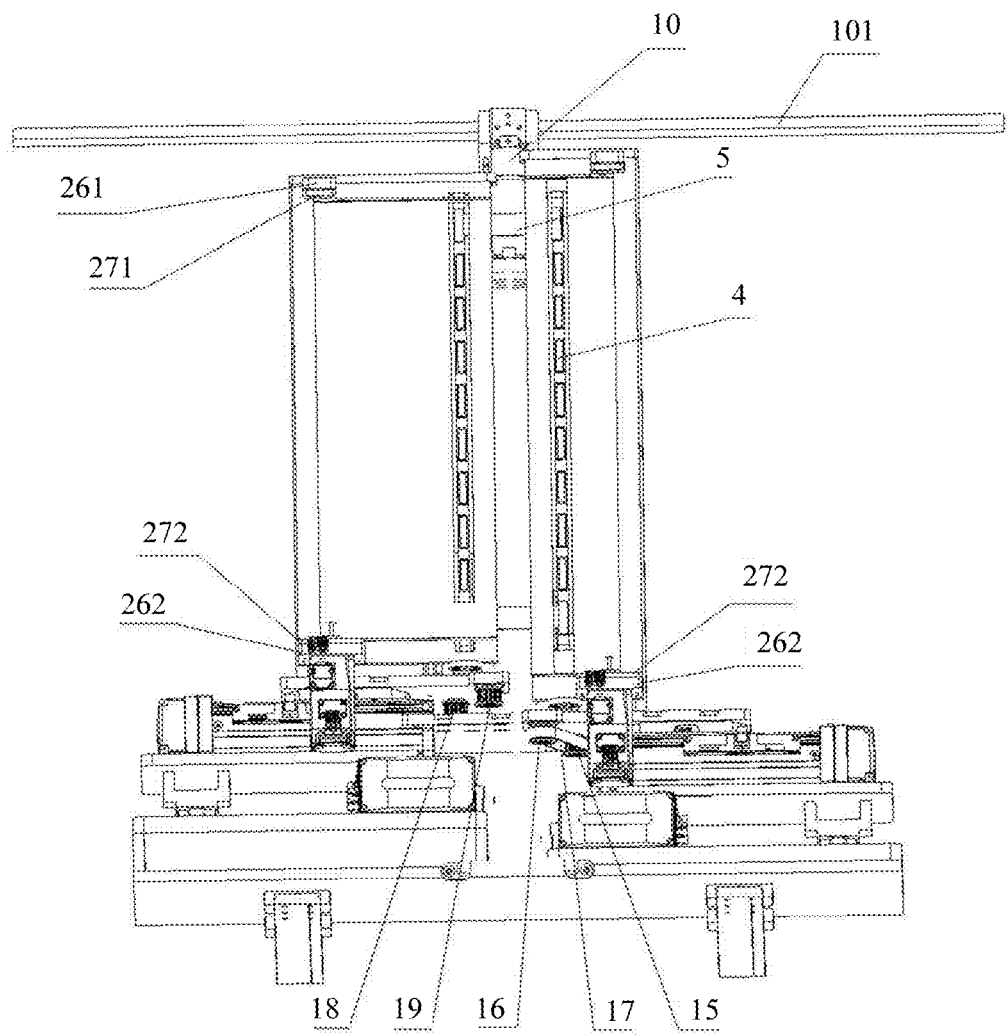
FIG. 7 is an axonometric view of a flexible circuit board test device according to an embodiment of this application from another perspective.

Referring to FIG. 5, FIG. 6 and FIG. 7, the first mobile table 8 and the second mobile table 9 are respectively provided with a first driving component 13 and a second driving component 14. In this embodiment, both the first driving component 13 and the second driving component 14 are motors. The first driving component 13 is vertically mounted on the first mobile table 8, a power output shaft of the first driving component extends downward from the first mobile table 8, and the power output shaft of the first driving component 13 is provided with a first transmission wheel 15. A lower end of the first main shaft 6 runs through the first mobile table 8 and extends downward, and the lower end of the first main shaft is provided with a second transmission wheel 16. The first transmission wheel 15 is connected to the second transmission wheel 16 through a transmission belt 17. When the first driving component 13 runs, the first main shaft 6 may be driven to rotate, so as to drive the first rotating shaft arm 2 to rotate.

Similarly, the second driving component 14 is vertically mounted on the second mobile table 9, a power output shaft of the second driving component extends downward from the second mobile table 9, and the power output shaft of the second driving component 14 is provided with a third transmission wheel 18. A lower end of the second main shaft 7 runs through the second mobile table 9 and extends downward, and the lower end of the second main shaft is provided with a fourth transmission wheel 19. The third transmission wheel 18 is in transmission connection with the fourth transmission wheel 19 through a transmission belt (not shown in the figures). When the second driving component 14 runs, the second main shaft 7 may be driven to rotate, so as to drive the second rotating shaft arm 3 to rotate.

The first driving component 13 and the second driving component 14 may drive the first rotating shaft arm 2 and the second rotating shaft arm 3 to perform unfolding and folding actions, so as to simulate an actual service state of a product (for example, a foldable phone).

The first mobile table 8 and the second mobile table 9 may not be on the same horizontal plane. In this embodiment, the first mobile table 8 is lower than the second mobile table 9, and the two mobile tables are staggered in height, so as to avoid a structural conflict between the two mobile tables during unfolding and folding actions and subsequent adjustment.

The first mobile table 8 and the second mobile table 9 are respectively provided with a mobile table driving mechanism, and the mobile table driving mechanisms are configured to drive the first mobile table 8 and the second mobile table 9 to move in a horizontal plane, so as to adjust positions of the two mobile tables with respect to the main clamp 1.

Specifically, using the mobile table driving mechanism of the first mobile table 8 as an example. The mobile table driving mechanism has a base 20 and an intermediate carrier 21, the intermediate carrier 21 is disposed parallel to the base 20, the first mobile table 8 is mounted on the intermediate carrier 21 through a first slide rail 22, the intermediate carrier 21 is provided with a third driving component 23, and the first mobile table 8 may be driven by the third driving component 23 to move in an X direction along the first slide rail 22. The intermediate carrier 21 is mounted on the base 20 through a second slide rail 24, the base 20 is provided with a fourth driving component 25, and the intermediate carrier 21 and the first mobile table 8 carried by the intermediate carrier may be driven by the fourth driving component 25 to move in a Y direction along the second slide rail 24.

The mobile table driving mechanism of the second mobile table 9 is the same as the mobile table driving mechanism of the first mobile table 8 in structure, so that the two mobile table driving mechanisms may be arranged symmetrically from left to right.

In view of the fact that the first mobile table 8 is lower than the second mobile table 9 in this embodiment, visually, the mobile table driving mechanism of the first mobile table 8 is also lower than the mobile table driving mechanism of the second mobile table 9, which structurally reflects that the base 20 of the second mobile table 9 is higher than the base 20 of the first mobile table 8 by a distance.

In this embodiment, both the third driving component 23 and the fourth driving component 25 are linear motors, and the first mobile table 8 and the second mobile table 9 are provided with two third driving components 23 and two fourth driving components 25. Certainly, other types of motors may also be used for driving. If a motor that outputs rotary motion is used, a corresponding power conversion mechanism needs to be added to convert the rotary motion of the motor into linear motion, such as a gear and a rack mechanism.

Because the first rotating shaft arm 2 and the second rotating shaft arm 3 are mounted on the first mobile table 8 and the second mobile table 9 respectively, the mobile tables, the rotating shaft arms and the main shafts may be moved as a whole by moving the driving mechanisms. Therefore, the first main shaft 6 of the first rotating shaft arm 2 and the second main shaft 7 of the second rotating shaft arm 3 may be adjusted in the X and Y directions, so that 0.3-2.0 mm bending radii may be simulated to implement stepless adjustment of the bending radii, and perform bending tests with different radii, which is compatible with scenarios of most foldable phones, so that the development requirements of different products can be met by using only one set of device.

In this embodiment, an image acquisition device 10 is further provided. The image acquisition devices 10 shown in FIG. 5 and FIG. 7 are CCD cameras. The image acquisition device 10 is configured to observe and record motion trajectory and morphology of the flexible circuit board 5, and can capture dynamic bending morphology of the flexible circuit board 5 at different angles of the rotating shaft arms in real time, calculate a bending radius at the moment, implement functions of magnification and position movement, and detect FPC morphology at key positions.

In addition, the image acquisition device 10 is mounted in an area above the main clamp 1 through a position adjusting mechanism 101. Observation and shooting positions of the image acquisition device 10 may be adjusted by controlling the position adjusting mechanism 101, so as to meet different test requirements.

Figure 9:
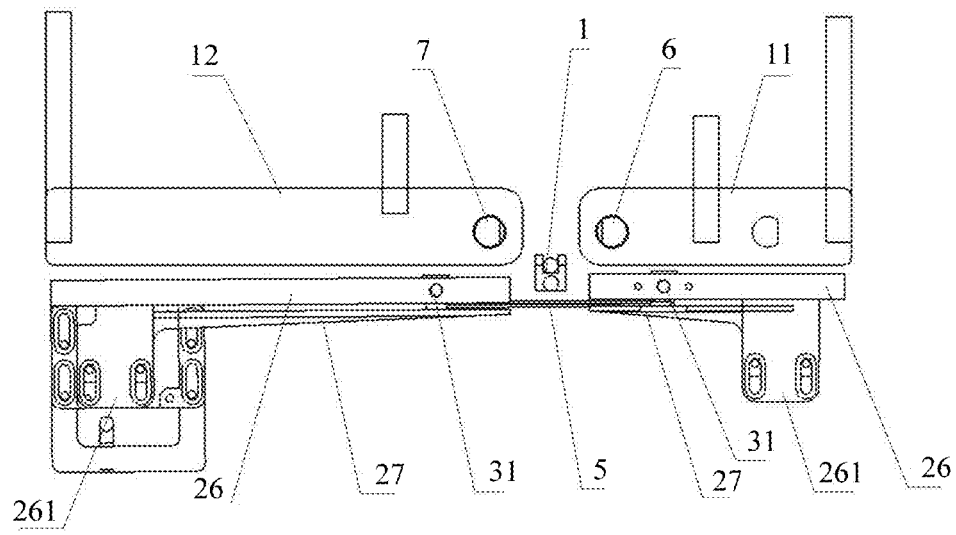
FIG. 9 is a top view of a flexible circuit board test device according to an embodiment of this application in an unfolded state.
Figure 10:
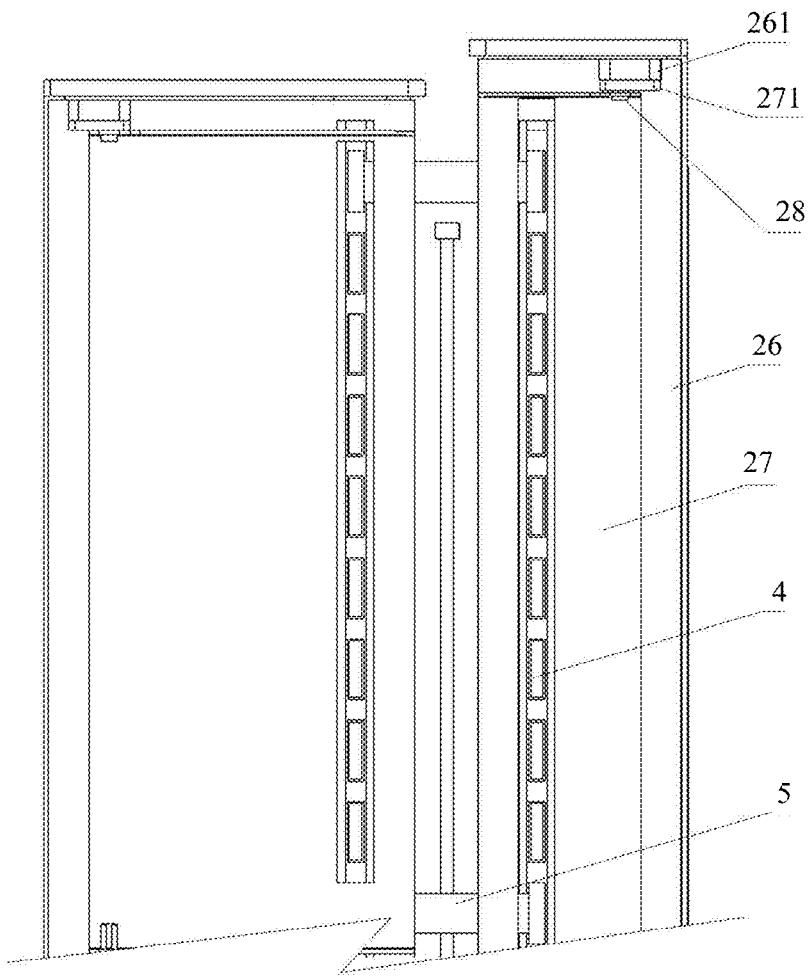
FIG. 10 is a front view (partial) of a flexible circuit board test device according to an embodiment of this application in an unfolded state.

As shown in FIG. 9 and FIG. 10, sandwich spaces are formed inside the first rotating shaft arm 2 and the second rotating shaft arm 3, so that a motion space of the flexible circuit board 5 may be simulated.

The first rotating shaft arm 2 and the second rotating shaft arm 3 are provided with auxiliary clamps 4. After the middle of the flexible circuit board 5 is located by the main clamp 1, two ends of the flexible circuit board enter the sandwich spaces of the first rotating shaft arm 2 and the second rotating shaft arm 3 respectively. In the sandwich spaces, the two ends of the flexible circuit board 5 are located by the auxiliary clamps 4, and the two ends of the flexible circuit board 5 and the auxiliary clamps 4 are electrically conductive, so as to implement electrical connection.

By simulating the motion space of the flexible circuit board 5 through the sandwich spaces formed inside the first rotating shaft arm 2 and the second rotating shaft arm 3, actual assembly morphology and motion trajectory of the flexible circuit board 5 may be tested, so as to provide more comprehensive and accurate test data for the design of the flexible circuit board 5.

Specifically, the first rotating shaft arm 2 and the second rotating shaft arm 3 each have a base plate 26 and a clamping plate 27 on one side of a pairing surface of the base plate, the clamping plate 27 is connected to the base plate 26, the base plate 26 of the first rotating shaft arm 2 is connected to the first main shaft 6, and the base plate 26 of the second rotating shaft arm 3 is connected to the second main shaft 7. After the clamping plate 27 is connected to the base plate 26, a sandwich space for simulating a motion space of the flexible circuit board 5 is formed between the clamping plate 27 and the base plate 26.

In this embodiment, a quantity of the auxiliary clamps 4 is more than one, and the plurality of auxiliary clamps 4 are arranged in a vertical direction on the base plate 26. During the test, a plurality of flexible circuit boards 5 to be tested are mounted in parallel in the sandwich spaces in a lateral posture, so that a plurality of sets of flexible circuit boards 5 may be tested at a time. To facilitate operation and observation, a vertical frame opening corresponding to the auxiliary clamps 4 is formed on the clamping plate 27 to expose a part of the auxiliary clamps 4. In this way, the whole sandwich space is constructed as a semi-open structure, which facilitates operation, observation, and shooting when the sandwich space is highly consistent with the environment of the integrated equipment, so that the collection of test data is easier and the test data is more accurate.

A first adjusting mechanism is disposed between the clamping plate 27 and the base plate 26, and a spacing between the clamping plate 27 and the base plate 26 may be adjusted by the first adjusting mechanism, so as to simulate sandwich spaces with different thicknesses.

A structure of the first adjusting mechanism is as follows: An upper connecting plate 261 and a lower connecting plate 262 are disposed respectively at an upper edge and a lower edge that are of the base plate 26 and that are on one side away from the main clamp 1, and the upper connecting plate 261 and the lower connecting plate 262 are perpendicular to a surface of the base plate 26. An upper connecting plate 271 and a lower connecting plate 272 are disposed respectively at an upper edge and a lower edge that are of the clamping plate 27 and that are on one side away from the main clamp 1, and the upper connecting plate 271 and the lower connecting plate 272 are perpendicular to a surface of the clamping plate 27. The upper connecting plate 261 of the base plate 26 is connected to the upper connecting plate 271 of the clamping plate 27 by an upper connector, and the lower connecting plate 262 of the base plate 26 is connected to the lower connecting plate 272 of the clamping plate 27 by a lower connector. Both the upper connector and the lower connector may be bolts (not shown in the figure), and bolt holes on the upper connecting plates 261, 271 and the lower connecting plates 262, 272 are oblong holes perpendicular to the surface of the base plate 26 in a length direction. In this way, after the bolts are loosened, a spacing between the clamping plate 27 and the base plate 26 may be adjusted in the direction of the oblong holes, and the clamping plate 27 may be fixed at an adjusted position after the bolts are fastened again, and an adjustment range may be 0-10 mm.

Figure 20:
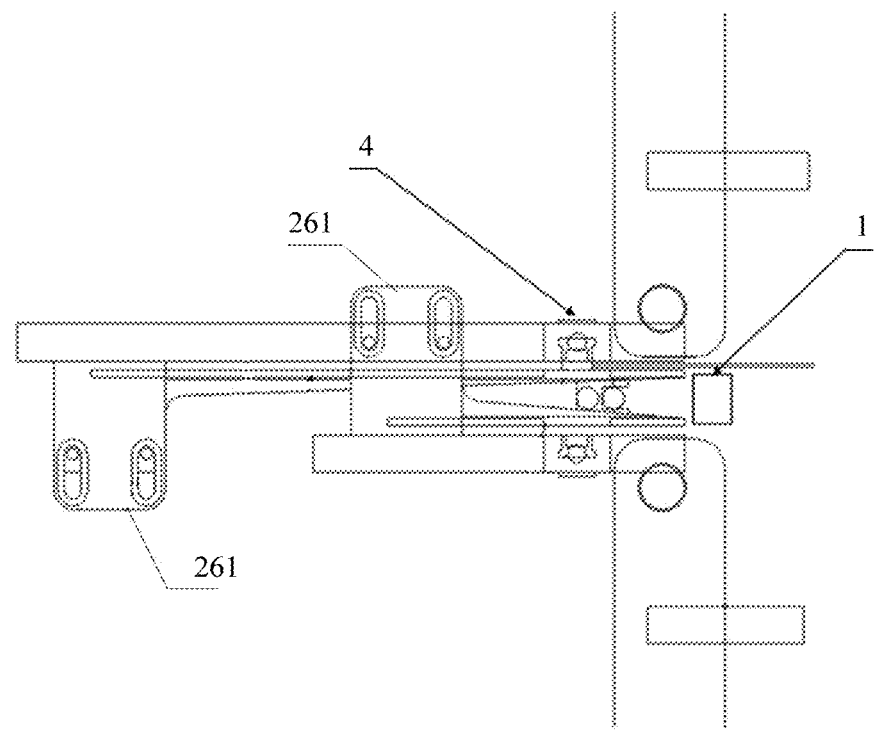
FIG. 20 is a schematic diagram showing that an upper connecting plate and a lower connecting plate of a first rotating shaft arm and an upper connecting plate and a lower connecting plate of a second rotating shaft arm are misaligned with each other in a folded state.

The first rotating shaft arm 2 has a lateral width smaller than that of the second rotating shaft arm 3, upper and lower ends of the first rotating shaft arm 2 go beyond upper and lower ends of the second rotating shaft arm 3. In this way, in a paired state, the upper connecting plates 261, 271 and the lower connecting plates 262, 272 of the first rotating shaft arm 2 and the upper connecting plates 261, 271 and the lower connecting plates 262, 272 of the second rotating shaft arm 3 may be misaligned with each other (as shown in FIG. 20), so as to avoid a structural conflict.

Figure 11:
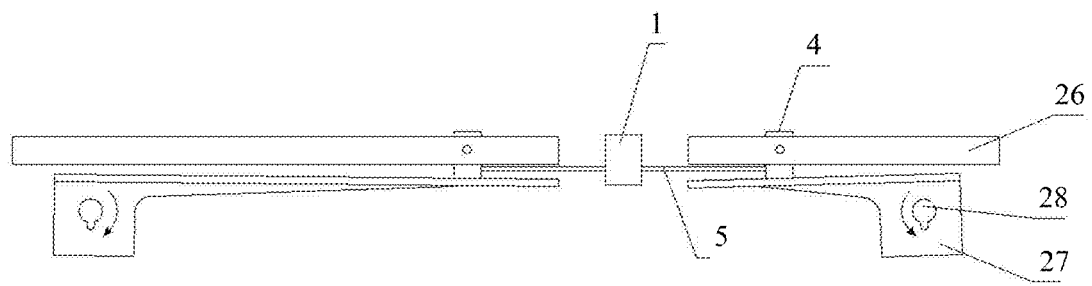
FIG. 11 is a schematic diagram showing adjustment made by a second adjusting mechanism.
Figure 19:
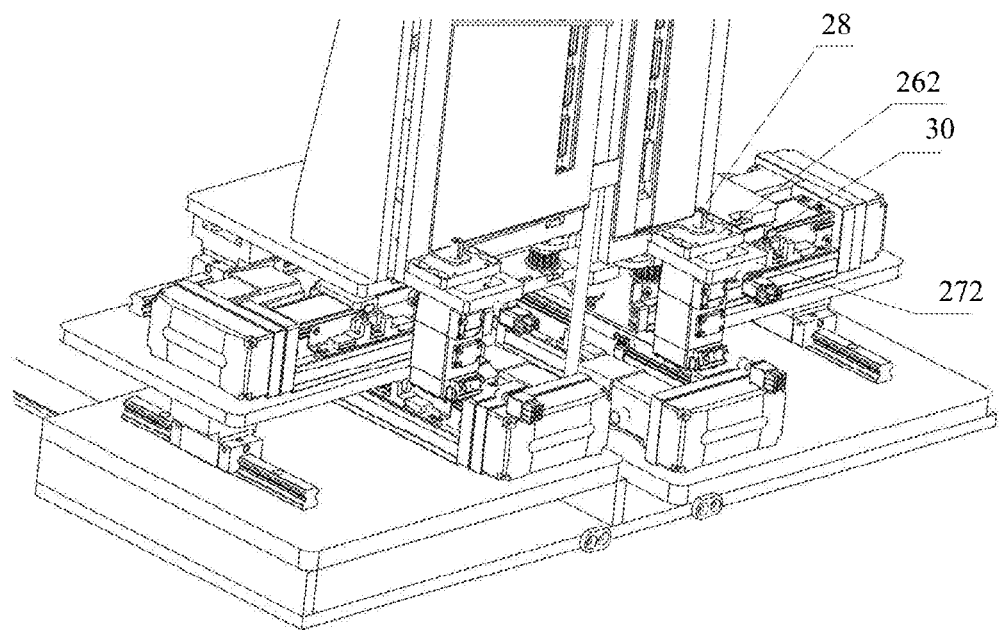
FIG. 19 is a partially enlarged view capable of showing a second adjusting mechanism of a flexible circuit board test device according to an embodiment of this application.

As shown in FIG. 11 and FIG. 19, a second adjusting mechanism is disposed between the clamping plate 27 and the upper connecting plate 271 and the lower connecting plate 272 thereof, and the second adjusting mechanism is configured to adjust an included angle between the clamping plate 27 and the base plate 26. A structure of the second adjusting mechanism will be described below by using the clamping plate 27 of the first rotating shaft arm 2 as an example.

The clamping plate 27 is connected to the upper connecting plate 271 and the lower connecting plate 272 through an oscillating shaft 28 to form a rotatable structure, where a fifth driving component 29 is disposed at bottom of the lower connecting plate 272 of the clamping plate 27. In this embodiment, the fifth driving component 29 is a motor, and the fifth driving component 29 is configured to drive the clamping plate 27 to rotate around the oscillating shaft 28. Similarly, the clamping plate 27 of the second rotating shaft arm 3 is adjusted by using the same structure. The lower connecting plate 262 of the base plate 26 is provided with a receding structure 30 corresponding to the fifth driving component 29, and the receding structure 30 has a shape of a frame opening. When an angle between the clamping plate 27 and the base plate 26 is adjusted by the second adjusting mechanism, the fifth driving component 29 may move in the frame opening, so as to avoid a structural conflict between the lower connecting plate 262 of the base plate 26 and the fifth driving component 29 during adjustment.

Rotational motion of the first rotating shaft arm 2 is independent of the second rotating shaft arm 3. In addition, with the second adjusting mechanism, the clamping plates 27 of the first rotating shaft arm 2 and the second rotating shaft arm 3 may implement independent degrees of freedom of rotation on the basis of overall rotation, so as to simulate an included angle between a middle frame and a screen after integrated equipment is folded, thereby further enhancing test capabilities.

Figure 8:
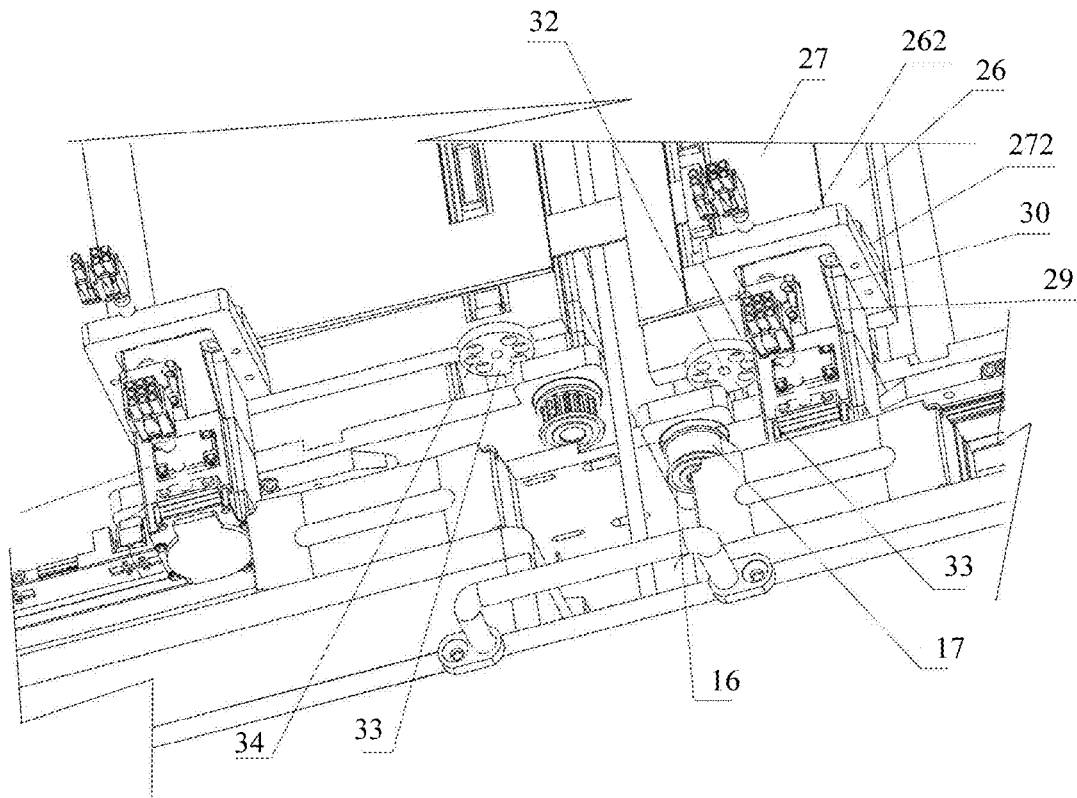
FIG. 8 is a partially enlarged view capable of showing a first driving component, a fifth driving component, and an adjusting disc of a third adjusting mechanism of a flexible circuit board test device according to an embodiment of this application.
Figure 12:
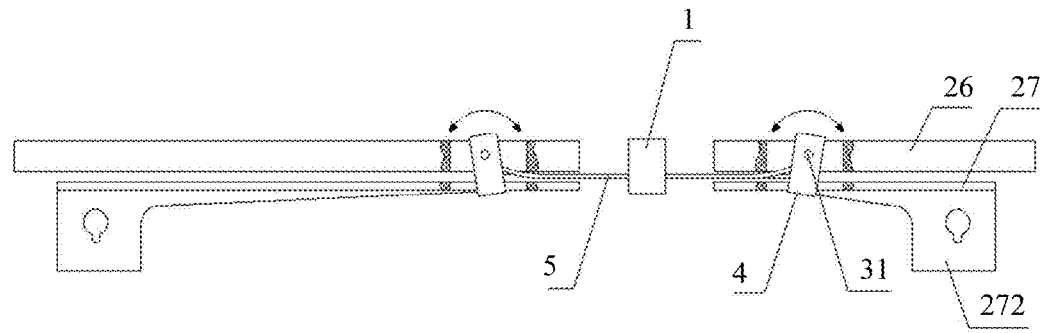
FIG. 12 is a schematic diagram showing adjustment made by a third adjusting mechanism.

As shown in FIG. 8 and FIG. 12, the base plate 26 is provided with a slot for accommodating the auxiliary clamps 4, the plurality of auxiliary clamps 4 are connected as a whole to form an auxiliary clamp assembly, the auxiliary clamp assembly is mounted in the slot of the base plate 26 through a third adjusting mechanism, and the third adjusting mechanism is configured to adjust a posture of the auxiliary clamp assembly with respect to the base plate 26.

Specifically, the third adjusting mechanism mainly includes an upper rotating shaft 31 and a lower rotating shaft 32 located at upper and lower ends of the auxiliary clamp assembly, and the auxiliary clamp assembly is rotatably mounted in the slot of the base plate 26 through the upper rotating shaft 31 and the lower rotating shaft 32, where a lower end of the lower rotating shaft 32 is connected to an adjusting disc 33, a plurality of connecting holes 34 centered on the lower rotating shaft are formed on the adjusting disc 33, and every two connecting holes on the diagonal line are a set. The adjusting disc may be connected to a lower end face of the base plate 26 by using screws or bolts. When the adjusting disc is connected to the base plate 26 through different connecting holes, the auxiliary clamp assembly may be fixed at different angles. An angle between the auxiliary clamps 4 and the base plate 26 shown in the figures may be adjusted among −45°, 0° and +45°, so as to simulate morphology of an unfolding and folding process of the flexible circuit board 5 in different architecture spaces of the integrated equipment, for example, in a foldable phone with different rotating shaft spaces.

That is, at an included angle of 0°, the flexible circuit board 5 is generally flat after being fixed by the main clamp 1 and the auxiliary clamps 4, and two ends of the flexible circuit board are generally perpendicular to the auxiliary clamps 4. However, at included angles of −45° and +45°, the flexible circuit board 5 is not completely flat, and there is a non-90° included angle between the two ends and the auxiliary clamps 4, so as to simulate different connection modes and/or lead-out modes that may exist between the flexible circuit board 5 and other electrical components in practice.

Figure 13:
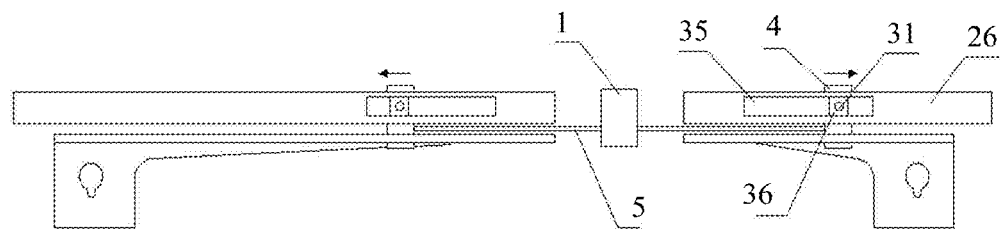
FIG. 13 is a schematic diagram showing adjustment made by a fourth adjusting mechanism.

As shown in FIG. 13, in other embodiments, a fourth adjusting mechanism may be further disposed between the auxiliary clamp assembly and the base plate 26, and the fourth adjusting mechanism is configured to adjust a lateral position of the auxiliary clamp assembly on the base plate 26.

For example, the fourth adjusting mechanism may have sliding grooves 35 disposed at the upper edge and the lower edge of the base plate 26, the upper rotating shaft 31 and the lower rotating shaft 32 of the third adjusting mechanism can move in a lateral direction in the sliding grooves 35 and can be located by locating components 36, and a surface of the base plate 26 is provided with a hollow area that provides a lateral movement space for the auxiliary clamp assembly.

In this way, a distance between the left and right auxiliary clamps 4 may be adjusted by adjusting positions of the upper rotating shaft 31 and the lower rotating shaft 32 on the base plate 26 laterally. Therefore, various flexible circuit boards 5 with different lengths may be tested, thereby further expanding the test range of the test device.

Figure 14:
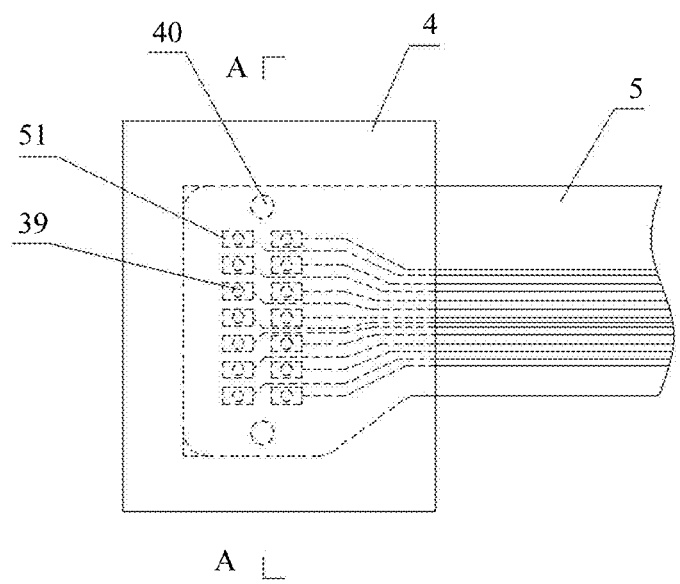
FIG. 14 is a schematic diagram of an electrical connection structure of auxiliary clamps.
Figure 15:
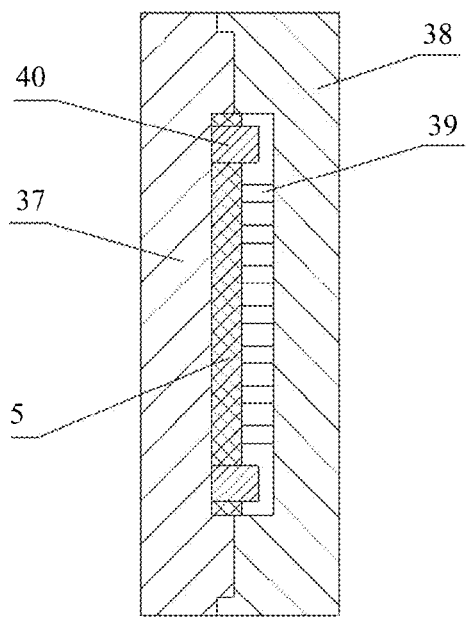
FIG. 15 is an A-A view of the electrical connection structure of the auxiliary clamps shown in FIG. 14.

As shown in FIG. 14 and FIG. 15, the auxiliary clamps 4 can locate both ends of the flexible circuit board 5, and are further provided with an electrical connection structure. The electrical connection structure mainly includes an electrical connection seat 37 and an electrical connection cover 38 that can be buckled with each other, a space for accommodating the ends of the flexible circuit board 5 is formed between the electrical connection seat 37 and the electrical connection cover 38, an inner surface of the electrical connection cover 38 is provided with conductive pins 39, the conductive pins 39 each have a micropin structure and correspond to pads 51 at one end of the flexible circuit board 5 one by one, and an inner surface of the electrical connection seat 37 is provided with a locating column 40 for locating the ends of the flexible circuit board 5.

A locating hole is formed at one end of the flexible circuit board 5. During the test, the locating hole on the flexible circuit board 5 is aligned with the locating column 40 on the electrical connection seat 37, and put into the electrical connection seat 37. Then, the electrical connection cover 38 is buckled on the electrical connection seat 37, and the flexible circuit board 5 is clamped and fixed. In addition, the conductive pins 39 on the inner surface of the electrical connection cover 38 are in contact with the pads 51 at the end of the flexible circuit board 5 to implement electrical conduction.

The two ends of the flexible circuit board 5 are electrified through the conductive pins 39 of the auxiliary clamps 4 without manual welding of wires, which saves device space. The flexible circuit board 5 is designed with good compatibility. During a dynamic bending test of the flexible circuit board 5, the flexible circuit board 5 is powered on throughout the test, and resistance changes are recorded. If resistance of the flexible circuit board 5 increases or in case of open circuit, the test may be automatically suspended, and the morphology, the quantity of bending times, and the bending angle of the flexible circuit board 5 at this time are recorded to complete a life test of the flexible circuit board 5.

Figure 17:
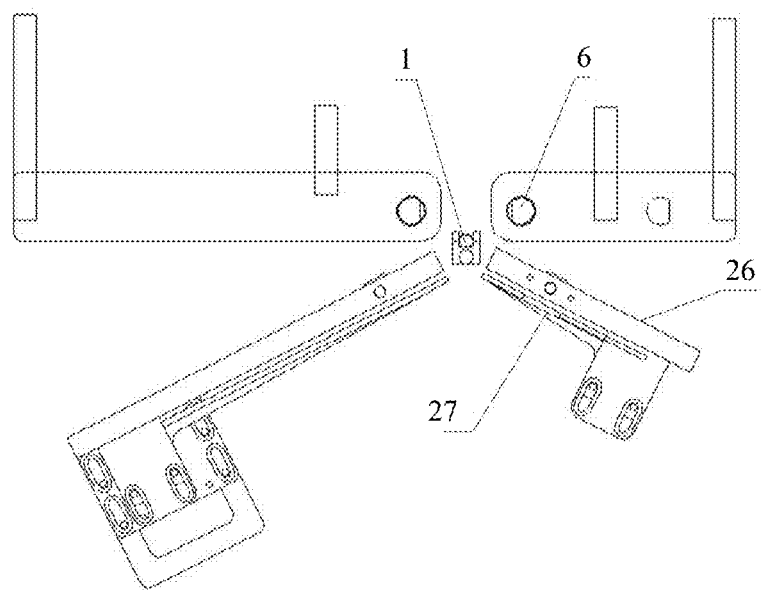
FIG. 17 is a top view of a flexible circuit board test device according to an embodiment of this application in a folding process.
Figure 18:
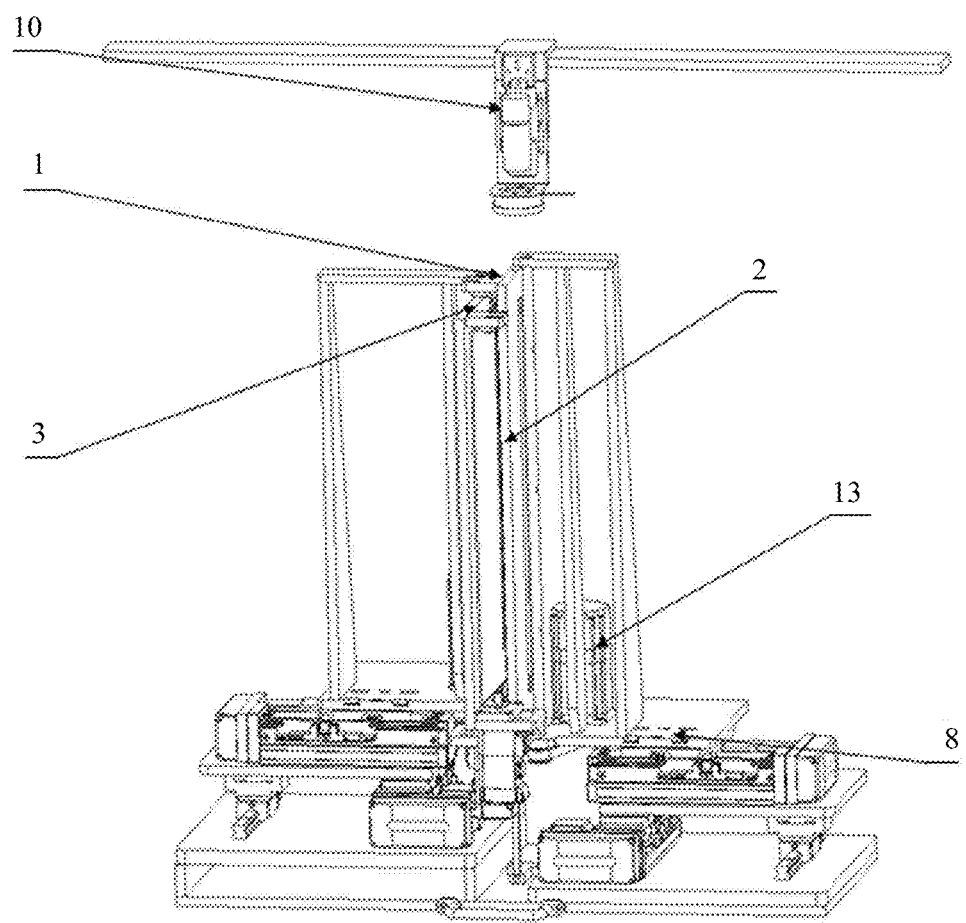
FIG. 18 is an axonometric view of a flexible circuit board test device according to an embodiment of this application in a folded state.

Referring to FIG. 9, FIG. 17 and FIG. 18, for the flexible circuit board test device provided in this application, by simulating the motion space of the flexible circuit board 5 through the sandwich spaces formed inside the first rotating shaft arm 2 and the second rotating shaft arm 3, actual assembly morphology and motion trajectory of the flexible circuit board 5 may be tested, so as to provide more comprehensive and accurate test data for the design of the flexible circuit board 5. In addition, the mobile tables on two sides of the main clamp 1 can be driven by the driving components to move, and positions of the first rotating shaft arm 2 and the second rotating shaft arm 3 with respect to the main clamp 1 may be adjusted. Therefore, a bending radius of the flexible circuit board 5 may be adjusted to perform bending tests with different radii, which is compatible with actual service scenarios of most products (for example, a foldable phone).

With the flexible circuit board test device provided in this application, at least the following different types of item tests may be carried out:

Test Item 1:

By adjusting a spacing between the first main shaft 6 and the second main shaft 7, bending tests with tens of thousands of times of bending are carried out at different bending radii to determine whether there is failure or minor damage. For example, different bending radii may be 0.30 mm, 0.45 mm, 0.60 mm, and 1.0 mm.

For this test item, the optimal design scheme for the flexible circuit board 5 under different bending radii, different lengths of flexible circuit boards and other parameters may be assessed by adjusting device parameters to find the optimal solution to product design.

Test Item 2:

Ten flexible circuit boards 5 are tested at a time, and bending tests with tens of thousands of times of bending are carried out. Circuit resistance of the flexible circuit boards 5 is detected and recorded. If the resistance increases by 10%, it is determined that the flexible circuit boards have failed. A quantity of bending times and bending angles of the flexible circuit boards 5 at this time are recorded.

As a dynamic bending reliability assessment test for flexible circuit boards, this test is used to analyze a bending performance baseline of the flexible circuit board 5 in the current design scheme. Through failure analysis on a single failed flexible circuit board 5, a failure location can be found, so as to optimize the design.

Test Item 3:

One flexible circuit board 5 is tested at a time, and bending tests with tens of thousands of times (for example, 50,000 times) of bending are carried out. After bending tests with 5,000/10,000/20,000/50,000 times of bending, the bending morphology of the flexible circuit board 5 at 0°/30°/45°/90° is detected, and the bending radius is measured.

This test item may be used to test whether the bending radius of the flexible circuit board 5 meets a requirement and whether there are potential risks. This test item may also be used to test morphological consistency of the flexible circuit board 5 after repeated bending.

Test Item 4:

The morphology of the flexible circuit board 5 in a 180° static bending scenario is simulated: After the first rotating shaft arm 2 and the second rotating shaft arm 3 are folded, the flexible circuit board 5 is bent to the maximum extent, the main clamp 1 releases the flexible circuit board 5, and the auxiliary clamps 4 fix both ends of the flexible circuit board 5 to simulate the morphology of the flexible circuit board 5 in a 180° bending scenario. The main clamp is used to simulate a bending area space, and the auxiliary clamps are used to control drop and a length of the flexible circuit board 5.

Figure 16:
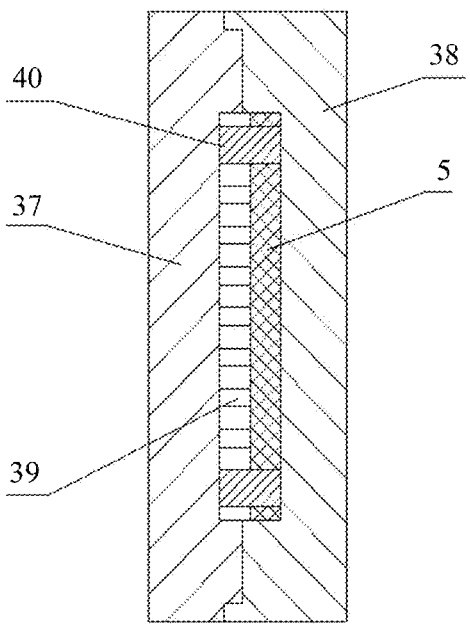
FIG. 16 is a sectional schematic diagram of another electrical connection structure of auxiliary clamps.

The forgoing embodiment is merely a preferred solution of this application, and is not specifically limited thereto. Based on this solution, a targeted adjustment may be made based on an actual requirement, to obtain different implementations. For example, the base plate 26 and the clamping plate 27 are mutually connected by other means, or the conductive pins 39 in the electrical connection structure of the auxiliary clamps 4 are migrated to the electrical connection seat 37 (as shown in FIG. 16). Because there are many possible implementations, examples are not described herein again.

With this test device, the bending life test for the flexible circuit board 5 may be carried out in advance, and the test may be carried out independent of complete materials such as structural members and rotating shafts of the integrated equipment. Reliability issues arouse ahead of product development, risks are identified in advance, so that design changes associated with rotating shafts of the flexible circuit board 5 are reduced, product development cost is reduced, test items are centralized, performance test related to the flexible circuit board 5 is focused, thereby eliminating the problem of early termination of the test caused by other product problems is eliminated, and effectively avoiding risks.

The foregoing has described the flexible circuit board test device provided in this application in detail. The principle and implementations of this application are described herein based on specific examples. The descriptions about the embodiments are merely intended to help understand the core concept of this application. It should be noted that a person of ordinary skill in the art may make several improvements and modifications to this application without departing from the principle of this application, and these improvements and modifications shall fall within the protection scope of this application.

What is claimed is:

1. A flexible circuit board test device, comprising:
   a main clamp, configured to locate a middle area of a flexible circuit board;
   a first rotating shaft arm and a second rotating shaft arm; wherein the first rotating shaft arm and the second rotating shaft arm are rotatably mounted on a first mobile table and a second mobile table through a first main shaft and a second main shaft respectively; the first main shaft and the second main shaft are located on two sides of the main clamp respectively; the first rotating shaft arm and the second rotating shaft arm each are provided with a sandwich space for simulating a motion space of the flexible circuit board; and the first mobile table is provided with a first driving component in transmission connection with the first main shaft, the second mobile table is provided with a second driving component in transmission connection with the second main shaft, and the first driving component and the second driving component are configured to drive the first rotating shaft arm and the second rotating shaft arm to perform unfolding and folding actions; and
   the first rotating shaft arm and the second rotating shaft arm are each provided with auxiliary clamps, and the auxiliary clamps are configured to locate two ends of the flexible circuit board that enter the sandwich space, and are electrically connected to the flexible circuit board, wherein the first rotating shaft arm and the second rotating shaft arm each comprise a base plate, and a clamping plate is located on one side of a pairing surface of the base plate and connected to the base plate, the base plate of the first rotating shaft arm is connected to the first main shaft, the base plate of the second rotating shaft arm is connected to the second main shaft, and the sandwich space is formed between the clamping plate and the base plate.

2. The flexible circuit board test device according to claim 1, wherein the first mobile table and the second mobile table are respectively provided with a mobile table driving mechanism, and the mobile table driving mechanism is configured to drive the first mobile table and the second mobile table to move in a horizontal plane to adjust positions of the first mobile table and the second mobile table with respect to the main clamp.

3. The flexible circuit board test device according to claim 2, wherein the mobile table driving mechanism comprises a base and an intermediate carrier; and the first mobile table and the second mobile table are mounted on the intermediate carrier through a first slide rail, and the intermediate carrier is provided with a third driving component for driving the first mobile table and the second mobile table to move along a first direction defined by the first slide rail; and
   the intermediate carrier is mounted on the base through a second slide rail, and the base is provided with a fourth driving component for driving the intermediate carrier to move along a second direction defined by the second slide rail.

4. The flexible circuit board test device according to claim 2, wherein the first mobile table is provided with a first frame, the second mobile table is provided with a second frame, and the first main shaft and the second main shaft are respectively mounted on adjacent edges of the first frame and the second frame.

5. The flexible circuit board test device according to claim 1, wherein a first adjusting mechanism is disposed between the clamping plate and the base plate, and the first adjusting mechanism is configured to adjust a distance of the clamping plate with respect to the base plate.

6. The flexible circuit board test device according to claim 5, wherein the first adjusting mechanism comprises two sets of upper connecting plates and lower connecting plates located at upper edges and lower edges that are of the base plate and the clamping plate and that are on one side away from the main clamp, the upper connecting plates and the lower connecting plates are respectively provided with oblong holes perpendicular to the base plate in a length direction, the upper connecting plates are connected by an upper connector running through the oblong holes, and the lower connecting plates are connected by a lower connector running through the oblong holes.

7. The flexible circuit board test device according to claim 6, wherein the first rotating shaft arm has a lateral width smaller than that of the second rotating shaft arm, upper and lower ends of the first rotating shaft arm go beyond upper and lower ends of the second rotating shaft arm; and in a paired state, the upper connecting plate and the lower connecting plate of the first rotating shaft arm and the upper connecting plate and the lower connecting plate of the second rotating shaft arm are misaligned with each other.

8. The flexible circuit board test device according to claim 6, wherein a second adjusting mechanism is disposed between the clamping plate and the upper connecting plate and the lower connecting plate thereof, and the second adjusting mechanism is configured to adjust an included angle between the clamping plate and the base plate.

9. The flexible circuit board test device according to claim 8, wherein the second adjusting mechanism comprises a rotating structure in which the clamping plate is connected to the upper connecting plate and the lower connecting plate thereof through an oscillating shaft; and a fifth driving component disposed at bottom of the lower connecting plate of the clamping plate, wherein the fifth driving component is configured to drive the clamping plate to rotate around the oscillating shaft.

10. The flexible circuit board test device according to claim 8, wherein a quantity of the auxiliary clamps is more than one, and the plurality of auxiliary clamps are arranged in a vertical direction on the base plate.

11. The flexible circuit board test device according to claim 10, wherein the base plate is provided with a slot for accommodating the auxiliary clamps, the plurality of auxiliary clamps are connected as a whole to form an auxiliary clamp assembly, the auxiliary clamp assembly is mounted on the base plate through a third adjusting mechanism, and the third adjusting mechanism is configured to rotate the auxiliary clamp assembly, so as to adjust a posture of the auxiliary clamp assembly with respect to the base plate.

12. The flexible circuit board test device according to claim 11, wherein the third adjusting mechanism comprises an upper rotating shaft and a lower rotating shaft located at upper and lower ends of the auxiliary clamp assembly, the auxiliary clamp assembly is rotatably mounted in the slot of the base plate through the upper rotating shaft and the lower rotating shaft, the lower rotating shaft is connected to an adjusting disc, and the adjusting disc is provided with a plurality of connecting holes centered on the lower rotating shaft and can be connected to the base plate through different connecting holes.

13. The flexible circuit board test device according to claim 12, wherein a fourth adjusting mechanism is disposed between the auxiliary clamp assembly and the base plate, and the fourth adjusting mechanism is configured to move the auxiliary clamp assembly laterally to adjust a lateral position of the auxiliary clamp assembly on the base plate.

14. The flexible circuit board test device according to claim 13, wherein the fourth adjusting mechanism comprises sliding grooves disposed at the upper edge and the lower edge of the base plate, the upper rotating shaft and the lower rotating shaft of the third adjusting mechanism can move in a lateral direction in the sliding grooves and can be located by locating components, and a surface of the base plate is provided with a hollow area that provides a lateral movement space for the auxiliary clamp assembly.

15. The flexible circuit board test device according to claim 1, wherein a frame opening corresponding to the auxiliary clamps is formed on the clamping plate.

16. The flexible circuit board test device according to claim 1, wherein the auxiliary clamps are provided with an electrical connection structure, the electrical connection structure comprises an electrical connection seat and an electrical connection cover that can be buckled with each other, a space for accommodating ends of the flexible circuit board is formed between the electrical connection seat and the electrical connection cover, and an inner surface of the electrical connection seat or the electrical connection cover is provided with conductive pins in contact conduction with pads at one end of the flexible circuit board.

17. The flexible circuit board test device according to claim 16, wherein the inner surface of the electrical connection seat or the electrical connection cover is provided with a locating column for locating the ends of the flexible circuit board.

18. The flexible circuit board test device according to claim 1, further comprising an image acquisition device that is mounted in an area above the main clamp through a position adjusting mechanism, wherein the image acquisition device is configured to observe and record motion trajectory and morphology of the flexible circuit board.

19. A flexible circuit board test device, comprising:
a main clamp, configured to locate a middle area of a flexible circuit board;
a first rotating shaft arm and a second rotating shaft arm;
wherein the first rotating shaft arm and the second rotating shaft arm are rotatably mounted on a first mobile table and a second mobile table through a first main shaft and a second main shaft respectively; the first main shaft and the second main shaft are located on two sides of the main clamp respectively; the first rotating shaft arm and the second rotating shaft arm each are provided with a sandwich space for simulating a motion space of the flexible circuit board; and the first mobile table is provided with a first driving component in transmission connection with the first main shaft, the second mobile table is provided with a second driving component in transmission connection with the second main shaft, and the first driving component and the second driving component are configured to drive the first rotating shaft arm and the second rotating shaft arm to perform unfolding and folding actions; and
the first rotating shaft arm and the second rotating shaft arm are provided with auxiliary clamps, and the auxiliary clamps are configured to locate two ends of the flexible circuit board that enter the sandwich space, and are electrically connected to the flexible circuit board;
the first rotating shaft arm and the second rotating shaft arm each comprise a base plate, and a clamping plate located on one side of a pairing surface of the base plate and connected to the base plate, the base plate of the first rotating shaft arm is connected to the first main shaft, the base plate of the second rotating shaft arm is connected to the second main shaft, and the sandwich space is formed between the clamping plate and the base plate;
a quantity of the auxiliary clamps is more than one, and the plurality of auxiliary clamps are arranged in a vertical direction on the base plate;
the base plate is provided with a slot for accommodating the auxiliary clamps, the plurality of auxiliary clamps are connected as a whole to form an auxiliary clamp assembly, the auxiliary clamp assembly is mounted on the base plate through a third adjusting mechanism, and the third adjusting mechanism is configured to rotate the auxiliary clamp assembly, so as to adjust a posture of the auxiliary clamp assembly with respect to the base plate;
the third adjusting mechanism comprises an upper rotating shaft and a lower rotating shaft located at upper and lower ends of the auxiliary clamp assembly, the auxiliary clamp assembly is rotatably mounted in the slot of the base plate through the upper rotating shaft and the lower rotating shaft, the lower rotating shaft is connected to an adjusting disc, and the adjusting disc is provided with a plurality of connecting holes centered on the lower rotating shaft and can be connected to the base plate through different connecting holes;

a fourth adjusting mechanism is disposed between the auxiliary clamp assembly and the base plate, and the fourth adjusting mechanism is configured to move the auxiliary clamp assembly laterally to adjust a lateral position of the auxiliary clamp assembly on the base plate; and the fourth adjusting mechanism comprises sliding grooves disposed at an upper edge and a lower edge of the base plate, the upper rotating shaft and the lower rotating shaft of the third adjusting mechanism can move in a lateral direction in the sliding grooves and can be located by locating components, and a surface of the base plate is provided with a hollow area that provides a lateral movement space for the auxiliary clamp assembly.

* * * * *